United States Patent
Gueckel

(10) Patent No.: US 6,916,987 B2
(45) Date of Patent: Jul. 12, 2005

(54) BUILT-IN UNIT FOR A TRANSMISSION CONTROL OF A MOTOR VEHICLE

(75) Inventor: Richard Gueckel, Landau/Pfalz (DE)

(73) Assignee: Robert Bosch GmbH, Stuttgart (DE)

( * ) Notice: Subject to any disclaimer, the term of this patent is extended or adjusted under 35 U.S.C. 154(b) by 394 days.

(21) Appl. No.: 10/315,878

(22) Filed: Dec. 10, 2002

(65) Prior Publication Data
US 2003/0116344 A1 Jun. 26, 2003

(30) Foreign Application Priority Data

Dec. 13, 2001  (DE) .......................... 101 61 230

(51) Int. Cl.⁷ .............................. H02G 3/08; H05K 5/00
(52) U.S. Cl. ...................... 174/52.1; 361/809; 439/76.2; 174/72 C
(58) Field of Search .............................. 174/52.1, 72 C; 361/809; 439/76.1, 76.2

(56) References Cited

U.S. PATENT DOCUMENTS

| | | | | |
|---|---|---|---|---|
| 5,452,948 A | * | 9/1995 | Cooper et al. ........... | 303/119.3 |
| 6,300,565 B1 | * | 10/2001 | Loibl et al. ................ | 174/52.3 |
| 6,515,228 B2 | * | 2/2003 | Albert et al. ............... | 174/52.3 |
| 6,626,056 B2 | * | 9/2003 | Albert et al. .................. | 74/335 |

FOREIGN PATENT DOCUMENTS

| DE | 43 44 584 C2 | 12/1996 |
|---|---|---|
| DE | 195 15 622 C2 | 6/2000 |
| DE | 100 10 609 A1 | 10/2000 |
| DE | 199 55 603 C1 | 2/2001 |

* cited by examiner

*Primary Examiner*—Hung V. Ngo
(74) *Attorney, Agent, or Firm*—Michael J. Striker

(57) ABSTRACT

A built-in unit (10) for a transmission control of a motor vehicle has a substrate plate (11), on which stamped grids (21, 22) are secured. The stamped grids electrically connect sensors and regulating elements with a control apparatus, which likewise is secured to the substrate plate (11). The individual conductor tracks (23, 24) of the stamped grids (21, 22) are fixed to one another by means of reinforcing elements, or injection-molded parts (25 through 28). Additional expanding mandrels (30) and expanding dowels (36) are provided on the reinforcing elements (25 through 28), whereby the expanding dowels project into openings (42) in the substrate plate (11). By means of the inventive construction of the reinforcing elements (25 through 28), a secure attachment of the stamped grids (21, 22) to the substrate plate (11) is made possible.

4 Claims, 3 Drawing Sheets

BUILT-IN UNIT FOR A TRANSMISSION CONTROL OF A MOTOR VEHICLE

BACKGROUND OF THE INVENTION

The present invention relates to a built-in unit for a transmission control of a motor vehicle. These types of built-in units are subject to high mechanical loads as a result of vibration force. Thus, it is common to arrange the stamped grid in guide channels in the substrate element, and to connect the conductor tracks of the stamped grids by means of reinforcing elements. In addition, it is known to provide cover caps above the stamped grids on the side opposite the substrate element, which limit the movement of the stamped grids transverse to its plane of extension. However, it has been shown that in spite of this, vibration breaks of the stamped grids occur. Therefore, a built-in unit is desirable, which makes possible an increased load upon vibration forces and at the same time, is relatively simple to make and mount.

SUMMARY OF THE INVENTION

The inventive built-in unit for a transmission control of a motor vehicle, in contrast, has the advantage that, mechanically, it has a high load carrying capacity, especially with regard to vibration load. This feature is achieved in the present invention substantially by secured attachment of the stamped grids with the substrate element, whereby the connection takes place on at least one of the provided reinforcing elements.

In addition, the present invention provides a simple mounting of the stamped grids to the substrate element, which is made possible when a retaining element projects from the underside of the reinforcing element, the underside facing toward the substrate element. The retaining element cooperates with a corresponding opening in the substrate element. In this manner, compared with normal assembly processes, in which the stamped grids are disposed in the guide channels on the substrate element, there is no change. A particularly simple mounting, in which no additional mounting elements are required, is provided by means of a form of the retaining element as an expanding dowel, in which an additional bolt element is arranged one-piece on the reinforcing element. Particularly advantageous is the formation of the openings as longitudinal holes, since in this case, longitudinal tolerances, or manufacturing tolerances, of the components can be compensated.

DETAILED DESCRIPTION OF THE PREFERRED EMBODIMENTS

Figure 1:
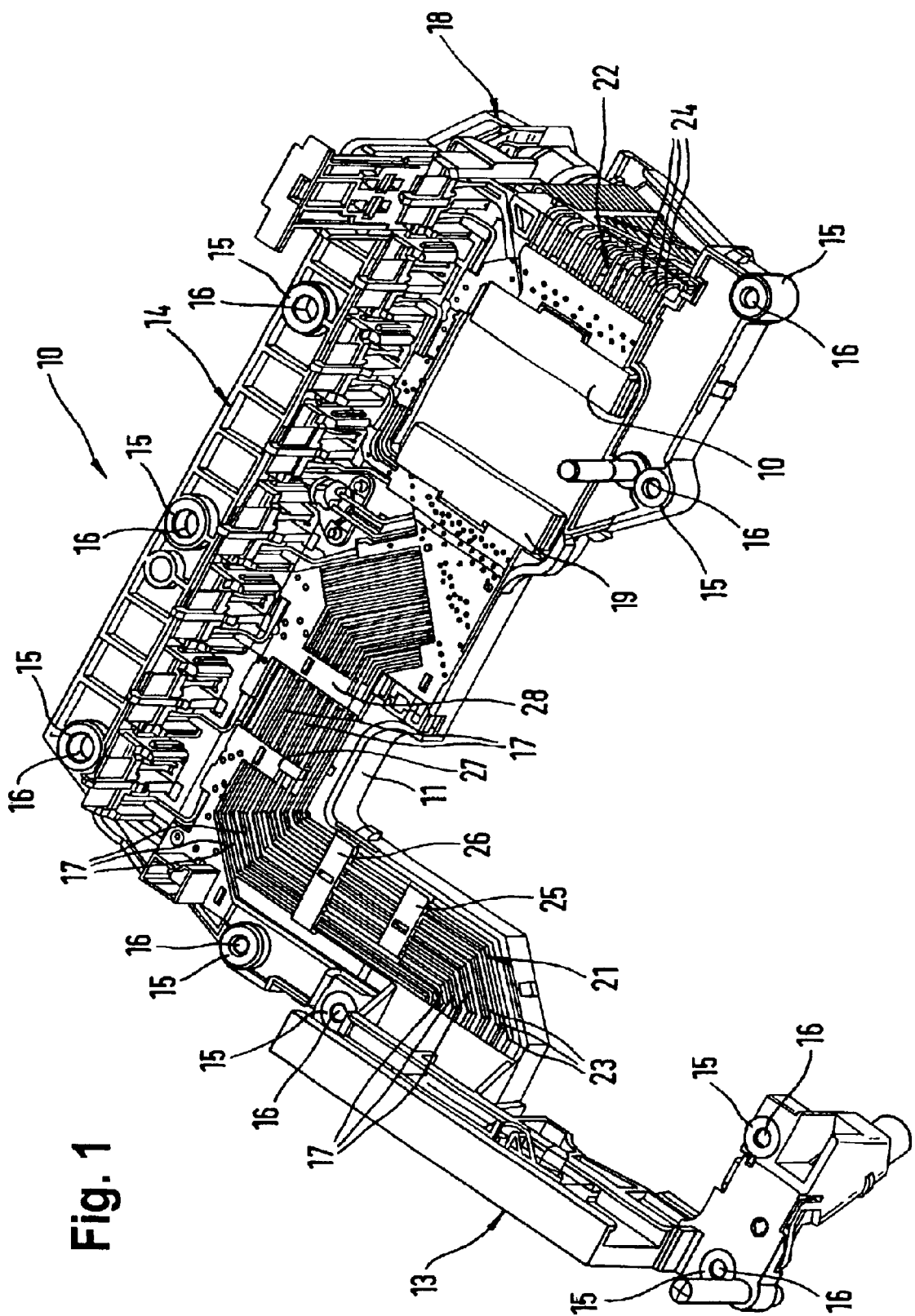
FIG. 1 shows the inventive built-in unit for a transmission control of a motor vehicle in a perspective view.

The built-in unit 10 for a transmission control of a motor vehicle, for example, is built into the transmission housing of the vehicle. The built-in unit 10 has a substrate plate 11, made from plastic in an injection molding process. The substrate plate 11 has a first receptacle 13 which is of one piece and closed in an approximately planar central area 12 and on two side surfaces for sensors (not shown), and a second receptacle 14 for regulating elements (also not shown), for example, hydraulic valves. For receiving the sensors or regulating elements, corresponding recesses are formed in the receptacles 13, 14, so that the sensors and the regulating elements, for example, are received form-lockingly in the receptacles 13, 14. In addition, the substrate plate 11 has mounting eyes 15 with through-bores 16, so that the substrate plate 11 can be secured to the transmission of the motor vehicle.

In the central area 12, also a non-illustrated control apparatus is disposed, which controls the regulating elements based on signals detected by the sensors, and which, via a plug connection 18, is coupled with the control electronics and the current supply of the vehicle. In order to protect the control apparatus from outside effects, cover caps 19, 20 for the control apparatus are mountable on the substrate plate 11.

The electrical connection between the sensors and the control apparatus, on the one hand, as well as the control apparatus and the regulating elements on the other hand, takes place by means of metallic stamped grids 21, 22. The stamped grids 21, 22 comprise, respectively rigid conductor tracks 23, 24 arranged parallel to one another. These conductor tracks 23, 24 are disposed on the substrate plate 11 between crosspieces or bars 17 injected on the substrate plate 11, the crosspieces serving as guide channels and which limit the movement of the conductor tracks 23, 24 in the plane of the substrate plate 11.

The conductor tracks 23, 24 are stamped or bent from a plate before their mounting in the built-in unit 10 in a separate manufacturing process and fixed to one another at several points by means of injection-molded pieces 25 through 28 which form reinforcing elements. These injection-molded pieces 25 through 28 are shown in FIG. 1 only on the sensor-side stamped grids 21. Of course, however, the side of the stamped grids 22 toward the regulating elements also has corresponding injection-molded pieces.

While the injection-molded pieces 26 and 28 cover all of the conductor tracks 23 of the grid 21, the injection-molded pieces 25 and 27 cover only a part of the conductor tracks 23. This type of injection-molded piece 25 through 28 is known. However, the inventive attachment of the injection-molded pieces 25 through 28 is novel, as is the corresponding attachment of the grid 21 to the substrate plate 11, which will be explained below with reference to FIGS. 2 and 3.

Figure 2:
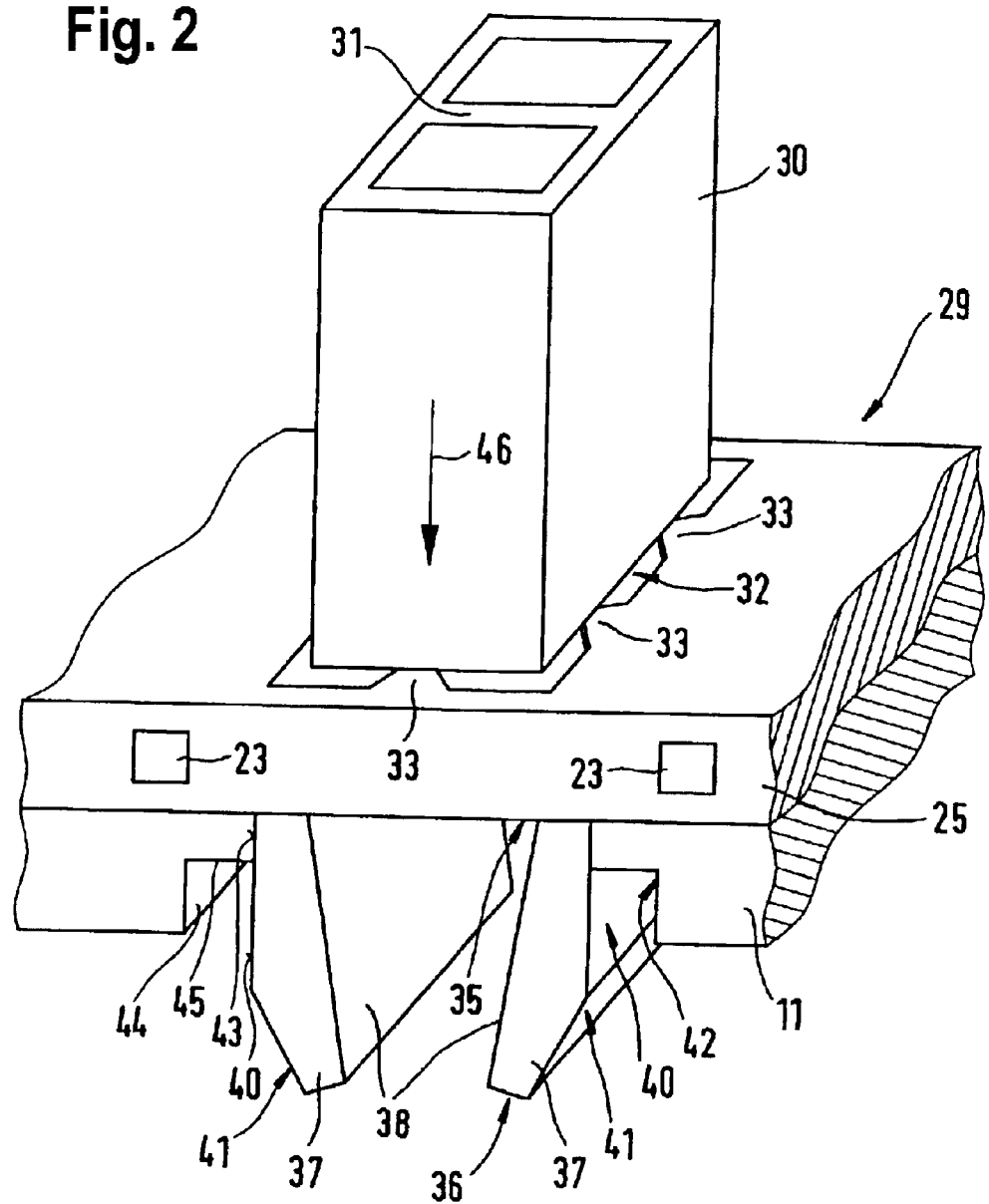
FIG. 2 shows a part of the built-in unit of FIG. 1 during various mounting phases of the stamped grids with the substrate plate, likewise in a perspective view.

In FIG. 2, the separately made grid 21 is shown with its injection-molded piece 25, as it is mounted in a first mounting step with the substrate plate 11 in the covering. One recognizes that the injection-molded piece 25 has an expanding mandrel 30 projecting from its upper side 29 between two conductor tracks 23. The mandrel 30 has a rectangular hollow cross-section with a crossbar 31. The mandrel 30 projects approximately into an opening 32 of the injection-molded piece 25 and is connected as one piece with the injection-molded piece 25 with a total of six injection-molded-on parts 33 divided over the opening 32.

An expanding dowel 36 with two expanding dowel elements 37 projects from the underside 35 of the injection-molded piece 25. The distance of the two expanding surfaces 38 of the expanding dowel elements 37, which are inclined toward one another, correspond at the location of the injection-molded-on part on the injection-molded piece 25 with the width of the expanding mandrel 30, which is arranged to be in alignment with the expanding dowel elements 37. The distance of the two expanding surfaces 38 reduces with increasing distance from the underside 35 of the injection-molded piece 25. The two expanding dowel elements 37, which are injection-molded onto the underside 35 of the injection-molded piece 25 and which are elastically pivotable at the location of the injection-molded-on part, have, respectively, two outer surfaces 40, 41 near the two, previously noted expansion surfaces 38 on the side opposite to the expansion surfaces 38.

When the reinforcing element 25 is covered with the substrate plate 11, the two expanding dowel elements 37 of the expanding dowel 36 are insertable into an opening 42 of the substrate plate 11. The opening 42 has a narrower width in a first area 43 facing the reinforcing element 35 than in a second area 44, which is connected with the first area 43 via a step 45. The width of the opening 42 in the first area 43 corresponds thereby with the distance of the two outer surfaces 40 of the expanding dowel elements 37, that is, it is in no case smaller than its distance. The two other outer surfaces 41, which are wedge-shaped on one another, serve to make possible a simple insertion of the expanding dowel 36 into the opening 42.

In FIG. 2, only the injection-molded piece 25 is illustrated. However, the other 26, 27, 38 also have corresponding expanding mandrels 30 and expanding dowels (respectively, at least one), and the substrate plate 11 has corresponding openings in the area of the injection-molded pieces 26, 27, 38, which enable an insertion of the expanding dowel into the corresponding openings. In order to further simplify the mounting of the grid 21 with the injection-molded pieces 25 through 28, it is further provided that the lengths of the openings 42 is larger than the corresponding lengths of the expanding dowels 36 with their expanding dowel elements 37, so that along the expanding dowel 36 (that is, parallel to the conductor tracks 23, 24), a free space is provided, which enables compensation of tolerances of the injection-molded pieces 35 on the grid 21.

The manufacture of the injection-molded pieces 25 through 28 with their expanding mandrels 30 and expanding dowels 36 takes place preferably in a single process step through a suitable injection molding tool for the grid 21, whereby upon injection molding, simultaneously, as already noted, the conductor tracks 23 are fixed to one another in the injection-molded pieces 25 through 28.

Figure 3:
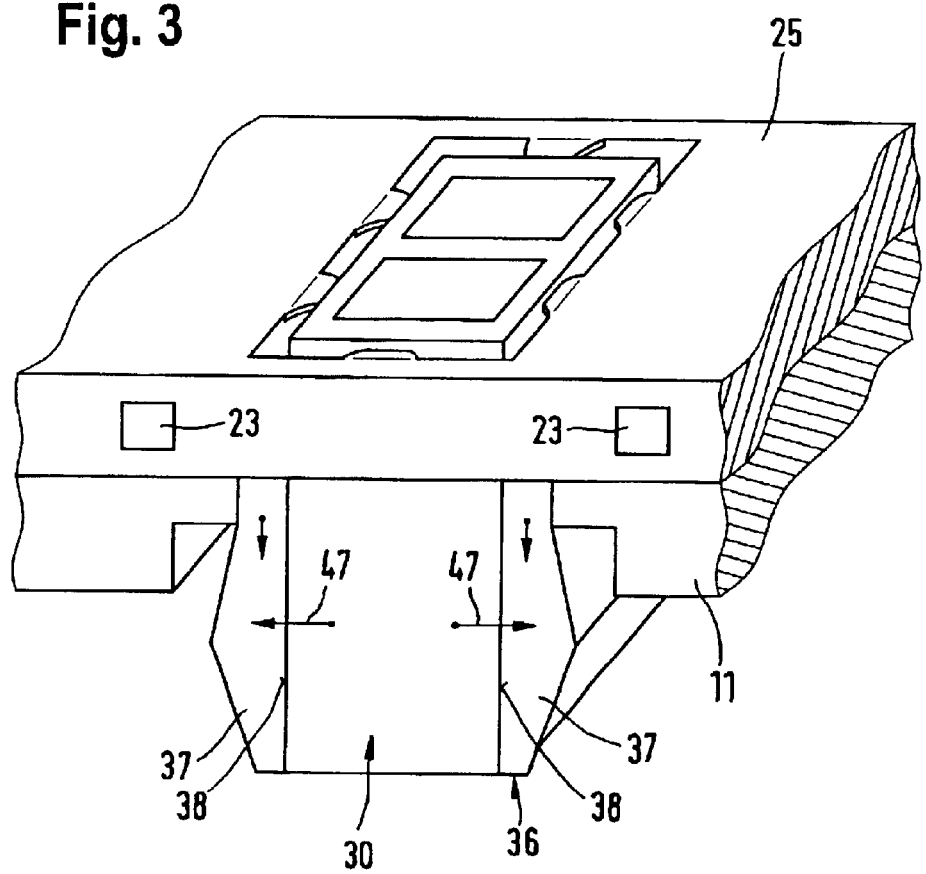
FIG. 3 also shows a part of the built-in unit of FIG. 2 during various mounting phases of the stamped grids with the substrate plate, also in perspective view.

After covering of the grid 21 with its injection-molded pieces 25 through 28 by the substrate plate 11, so that the surfaces of the injection-molded pieces 25 through 28 and the substrate plate 11 facing one another directly lie on one another, the expanding mandrel 30 is pressed in the direction of the arrow 46 through the opening 32 in the direction of the expanding dowel 36 by means of a suitable tool. The end state is shown in FIG. 3. Upon pressing-in of the expanding mandrel 30, the injection-molded-on parts 33 are broken or destroyed, and the expanding mandrel 30 moves both expanding dowel elements 37 in the direction of the arrow 47 away from one another. The height of the expanding mandrel 30 is such that it corresponds to the total of the thickness of the injection-molded piece 25 and the height of the expanding dowel 36, so that in the end state shown in FIG. 3, the upper or the lower end face of the expanding mandrel 30 is connected flush with the top side 29 of the injection-molded piece 25 and the underside of the expanding dowel 36.

The pivoting movement of the two expanding dowel elements 37 or expanding surfaces 38 from one another takes place by means of an elastic swiveling on the injection-molding-on position of the expanding dowel elements 37 on the injection-molded pieces 25. When the expanding mandrel 30 is completely pressed into the expanding mandrel 36, a self-locking of the expanding mandrel 30 occurs, so that the vibrations and accelerations acting in operation of the built-in unit no longer can cause a release or loosening of the expanding mandrel 30 in the expanding dowel 36. The expanding mandrel 30 is thus held by a frictional connection between the two expanding dowel elements 37.

The inventive built-in unit can be modified in a number of ways and should not be limited to the examples described and illustrated herein. It is also contemplated, for example, that additional insertion chamfers could be provided on the substrate plate 11 on the side facing toward the stamped grids 21, 22 on the opening 42, which facilitate the insertion of the expanding mandrel 36 during the assembly process. It is also contemplated that the injection-molded pieces 25 through 28 are not relatively narrow relative to the longitudinal extension of the conductor tracks 23, 24, as shown in the figures; rather, the injection-molded pieces could be formed to be all over a large area of the stamped grids 21, 22, whereby preferably multiple expanding mandrels are arranged on this reinforcing element.

It will be understood that each of the elements described above, or two or more together, may also find a useful application in other types of constructions differing from the types described above.

While the invention has been illustrated and described herein as a built-in unit for the transmission control of a motor vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. A built-in unit (10) for a transmission control of a motor vehicle, having a substrate element (11), preferably made of plastic, on which receptacles for sensor elements and regulating elements are embodied, having stamped grids (21, 22) for electrical connection between the sensor elements and a control unit, on the one hand, and between the control unit and the regulating elements, on the other, wherein the stamped grids (21, 22) have rigid conductor tracks (23, 24) disposed parallel to one another, which are disposed at least in part in guide channels (17) in the substrate element (11), wherein the conductor tracks (23, 24) are joined to one another by means of reinforcing elements (25 through 28) extending in a plane of the stamped grids (21, 22) and formed by an injection-molding of the conductor tracks (23, 24), characterized in that at least one reinforcing element (25 through 28) can be joined to the substrate element (11).

2. The built-in unit as defined in claim 1, characterized in that a retaining element (36), which cooperates with an opening (42) in the substrate element (11), protrudes from the underside (35), orientated toward the substrate element (11), of the at least one reinforcing element.

3. The built-in unit as defined in claim 2, characterized in that a retaining element is an expanding dowel (36), which in a region between two conductor tracks (23, 24) is disposed one-piece on at least one reinforcing element (25 through 28); and that a bolt element (30), which can be introduced between two elements (37) of the expanding dowel (36), is disposed on a top side (29) of the at least one reinforcing element (25–28) and is injection-molded onto the reinforcing element (25 through 28).

4. The built-in unit as defined in claim 3, characterized in that the opening (42) is an oblong slot (42), whose length parallel to the conductor tracks (23, 24) is greater than a corresponding length of the expanding dowel (36).

* * * * *